United States Patent [19]

Yoshioka et al.

[11] Patent Number: 5,580,395
[45] Date of Patent: Dec. 3, 1996

[54] SOLAR CELL WITH INTEGRATED BYPASS FUNCTION

[75] Inventors: Hideki Yoshioka, Nara; Tadashi Hisamatsu, Kashihara, both of Japan

[73] Assignee: Sharp Kabushiki Kaisha, Osaka, Japan

[21] Appl. No.: 502,294

[22] Filed: Jul. 13, 1995

[30] Foreign Application Priority Data

Jul. 19, 1994 [JP] Japan .................. 6-167239
May 25, 1995 [JP] Japan .................. 7-126234

[51] Int. Cl.⁶ ..................... H01L 31/06
[52] U.S. Cl. ..................... 136/255
[58] Field of Search ..................... 136/255

[56] References Cited

U.S. PATENT DOCUMENTS 5,223,044  6/1993  Asai ..................... 136/255
5,330,584  7/1994  Saga et al. ..................... 136/255

FOREIGN PATENT DOCUMENTS 3-120762  5/1991  Japan ..................... 136/255
3-102749  10/1992  Japan ..................... 136/255

Primary Examiner—Aaron Weisstuch
Attorney, Agent, or Firm—Nixon & Vanderhye P.C.

[57] ABSTRACT

A solar cell with integrated bypass function includes: a first conductivity type substrate 1 selected from P-type and N-type substrates; a region 2 of a second conductivity type which is opposite to the first conductivity type, the region 2 being formed on a light receiving side of the substrate; at least one third region 4 of the first conductivity type, having a higher dopant impurity concentration than the substrate 1 and being formed in a portion of the light receiving side of the substrate 1 so as to be in contact with both the substrate 1 and the region 2 of the second conductivity type; an insulator film 9 formed on at least a part of the at least one third region 4; and a light receiving side electrode 7 formed on the insulator film 9 so as to be in partial contact with the region 2 of the second conductivity type.

6 Claims, 10 Drawing Sheets

1: P-TYPE SUBSTRATE

10: OXIDE FILM

4: $P^+$-TYPE REGION

3: $P^+$-TYPE REGION

2: N-TYPE REGION

8: ANTI-REFLECTION COATING

5: N-ELECTRODE CONNECTING PORTION

6: P-ELECTRODE

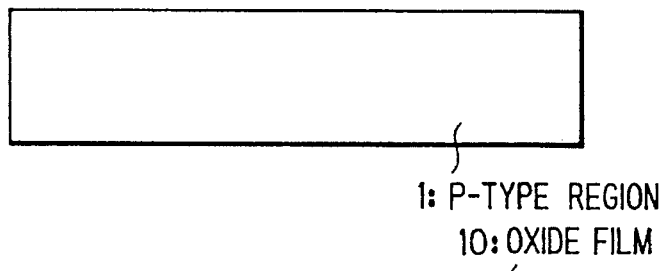
FIG.11A
1: P-TYPE REGION
10: OXIDE FILM
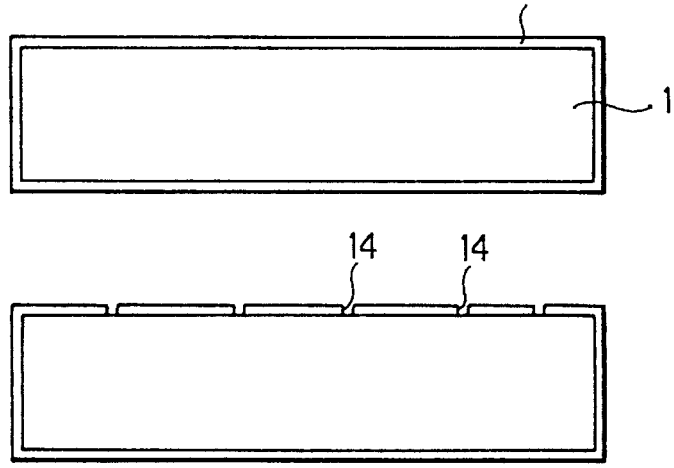
FIG.11B
FIG.11C
FIG.11D 4: P⁺-TYPE REGION
FIG.11E 2: N-TYPE REGION
7: N-ELECTRODE  8: ANTI-REFLECTION COATING  5: N-ELECTRODE CONNECTING PORTION
9: INSULATE FILM
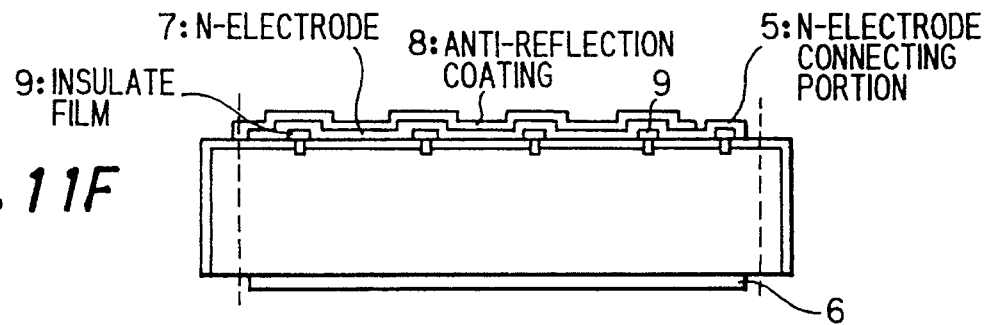
FIG.11F

SOLAR CELL WITH INTEGRATED BYPASS FUNCTION

BACKGROUND OF THE INVENTION (1) Field of the Invention

The present invention relates to a solar cell which converts light energy into electric energy and, in particular, relates to a solar cell with an integrated bypass function in which the function of a bypass diode for protecting the solar cell from a reverse bias voltage is added.

(2) Description of the Prior Art

A solar cell module is typically composed of a large number of solar cells connected in parallel and/or in series in order to obtain a desired output voltage with a desired output current. If part of a solar cell or some of the cells are shaded, voltages generated by the other cells are applied to the shaded cells as reverse bias voltages. If a reverse bias voltage exceeding the peak inverse voltage of a shaded cell (breakdown voltage) is applied to the cell, the cell may be short-circuited and damaged, whereby the output characteristics of the entire solar cell module could be degraded.

In the case of solar cell modules for space applications such as a satellite, part of the satellite body or elements thereof such as antennas, etc. could shade the solar cell module while the attitude of the satellite is controlled. For terrestrial uses, neighboring buildings, for example, can shade the solar cells, or birds flying by the solar cells can deposit fecal matter thereon which shades the solar cells.

As an example of such cases, discussion will be made of a case where a part of the surface of a solar cell module consisting of a number of solar cells connected in parallel is shaded. In a shunt mode as shown in FIG. 4A where a solar cell module M is substantially short-circuited between both terminals thereof, when a submodule 11 is shaded, a reverse bias $V_{12}$ generated across the submodule group 12 which remains unshaded is applied to the submodule 11. If the voltage across the submodule 11 is $v_{11}$, it can be expressed as $V_{11}=-V_{12}$.

When an external power source $V_B$ is connected to the solar cell module M as illustrated in FIG. 4B, $V_{11}$ is represented by $V_{11}=V_B-V_{12}$.

That is, when a positive voltage is applied to the N-electrode of the shaded submodule 11, if the reverse bias voltage is greater than the peak inverse voltage of the solar cells constituting the submodule 11, the solar cells are short-circuited and may be damaged, whereby the shaded submodule 11 and consequently the whole solar cell module M may become degraded in output characteristics.

In order to avoid hazards of this kind due to the reverse bias voltage, a bypass diode is provided for each solar cell or for every solar cell module; alternatively, so-called "diode integrated" solar cells are used in which bypass diodes are integrated in the solar cells. Beside these, there also is known a "solar cell with integrated bypass function".

An example of a prior art solar cell with integrated bypass function will now be explained with reference to drawings. FIG. 1 is a plan view showing a structure of a solar cell with integrated bypass function proposed by the present applicant (Japanese Utility Model Application Hei 3-102,749) and FIG. 2 is a sectional view thereof taken on a line 20–21 in FIG. 1.

As illustrated in FIG. 1, a light receiving face of the solar cell is covered with a transparent antireflection coating 8. Under the coating 8, strip shaped N-contact electrodes 7 connected together at their ends with a bar-shaped N-contact electrode connecting portion 5 are arranged like a comb over an N-type region 2.

As shown in FIG. 2, the cell is composed of a P-type silicon substrate 1, the N-type region 2 formed on the light receiving face of the substrate 1, a $P^+$-type region 3 formed beneath the substrate 1 for providing a BSF effect, $P^+$-type islands 4 partially formed on the light receiving face of substrate 1, the N-electrode 7 formed on the surface of the N-type region 2, the antireflection coating 8 covering approximately the entire N-type region 2 and a P-electrode 6 covering approximately the entire underside of the $P^+$-type region 3.

The solar cell thus configured is produced by the procedures shown in step-order sectional views shown in FIGS. 3A through 3F.

First, the whole surface of a P-type silicon substrate 1 shown in FIG. 3A is subjected to thermal oxidation or the like so that an oxide film 10 is formed, as shown in FIG. 3B. Subsequently, as shown in FIG. 3C, the oxide film 10 on the underside is removed, and holes 14, 14, . . . are formed on the surface of the oxide film 10 by the photolithographic or any other technique. These holes 14, 14, . . . correspond to $P^+$-type islands 4, 4, . . . which will be formed next. Then, a $P^+$-type impurity is diffused into the wafer to an impurity concentration of $1\times10^{20}cm^{-3}$, for instance.

Thereafter, the remaining oxide film 10 on the top and side faces is removed so as to produce a wafer shown in FIG. 3D. This wafer has a number of $P^+$-type islands 4, 4, . . . formed on the top surface thereof and the $P^+$-type region 3 formed over the undersurface thereof. Subsequently, as shown in FIG. 3E, the N-type region 2 is formed on the top and side faces by the thermal diffusion technique or the like. Since the $P^+$-type islands 4, 4, . . . are protected by the boron glass remaining on the topmost layer thereof, these regions are unaffected and kept in the form of islands in the N-type region 2.

Next, as shown in FIG. 3F, the comb-shaped N-contact electrodes 7 and the N-contact electrode connection portion 5 (not shown in the figure) are formed on the top surface. Then, the antireflection coating 8 is formed on the top of the wafer while the P-contact electrode 6 is vacuum evaporated on the undersurface thereof. The thus formed wafer is cut at both ends indicated by broken lines, whereby a solar cell as shown in FIGS. 1 and 2 is obtained.

A large number of the thus prepared solar cells are connected in series and in parallel as shown in FIG. 4A to output a desired voltage and a desired current. The thus formed assembly is used as a typical solar cell module M.

External attachment of bypass diodes to the solar cell for the purpose of preventing the solar cell from being damaged by the reverse bias voltage, results in increased cost for bypass diodes as well as the manufacturing cost of the attachment process. Further, this method suffers from another problem that the packaging density of solar cells is decreased.

Since, in the conventional diode integrated solar cell, a bypass diode and a solar cell are formed together in a silicon substrate, the manufacturing process becomes complicated, resulting in increased production cost. Further, the conventional solar cell with integrated bypass function has island shaped $P^+$ regions that occupy part of the cell surface, so that the effective area of the solar cell is decreased, whereby the conversion efficiency is lowered.

SUMMARY OF THE INVENTION

In view of what has been discussed above, it is therefore an object of the present invention to provide a solar cell with integrated bypass function in which high conversion efficiency is obtained without reducing the effective area of the solar cell.

To attain the above object, the solar cell of the present invention is configured as follows.

A solar cell with integrated bypass function comprises: a first conductivity type substrate selected from P-type and N-type substrates; a region of a second conductivity type which is opposite the first conductivity type, the region being formed on a light receiving side of the substrate; at least one third region of the first conductivity type, having a higher dopant impurity concentration than the substrate and being formed in a portion of the light receiving side of the substrate so as to be in contact with both the substrate and the region of the second conductivity type; an insulator film formed on at least part of the third region; and a light receiving side electrode formed on the insulator film so as to be in partial contact with the region of the second conductivity type.

In the present invention, the quality of the insulator film may be improved by effecting a heat treatment after the formation of the film.

In the present invention, the third region of the first conductivity type is formed as plural islands.

In the present invention, the density of the islands as the third region of the first conductivity type increases as the position of islands becomes closer to the portion of the light receiving surface electrode connected to an output terminal.

When a reverse bias voltage is applied to the thus configured solar cell of the present invention, the reverse bias voltage is applied to a $P^+N$ junction formed between the receiving side region of the second conductivity type (N-type, for example) and the region of the first conductivity type ($P^+$, for example) which has a higher dopant impurity concentration and is formed in contact with the region of the aforementioned second conductivity type. This part more easily achieves breakdown due to the Zener effect or avalanche effect than the PN junction formed between the substrate of the first conductivity type (P-type, for example) and the diffused layer of the second conductivity type (N-type, for example).

When a relatively low reverse bias voltage is applied to the part, a reverse current flows in the region. Further, when the reverse bias becomes higher, the part reaches breakdown due to the Zener effect or avalanche effect, whereby the solar cell can be prevented from being applied with the reverse bias voltage.

Describing the above effect using an equivalent circuit as shown in FIG. 12, the solar cell of the present invention is constructed so that an $NP^+$ diode is connected in parallel with a solar cell made of a NP junction. When a reverse bias voltage is applied, current flows through the $NP^+$ diode which allows a greater leakage current in the reverse direction, whereby the solar cell of the NP junction can be protected from breakdown.

Since, in the present invention, the $P^+$-region forming the aforementioned $NP^+$ diode is formed right under the N-contact electrode with the insulator film therebetween, no reduction of the power-generating area (effective light receiving area) occurs, unlike the prior art solar cell of this type.

Since, in the present invention, the $P^+$-region forming the aforementioned $NP^+$ diode is formed right under the N-electrode with the insulator film therebetween, it is possible to shorten the distance between the N-contact electrode to which a reverse bias voltage is applied and the $P^+$-region.

Therefore, it is possible to reduce the equivalent series resistance, and therefore to further improve the protecting function against application of reverse bias voltage.

BRIEF DESCRIPTION OF THE DRAWINGS

FIGS. 11A–11F are sectional views illustrating the steps of a process for producing the solar cell shown in FIG. 9;

DESCRIPTION OF THE PREFERRED EMBODIMENTS

Figure 1:
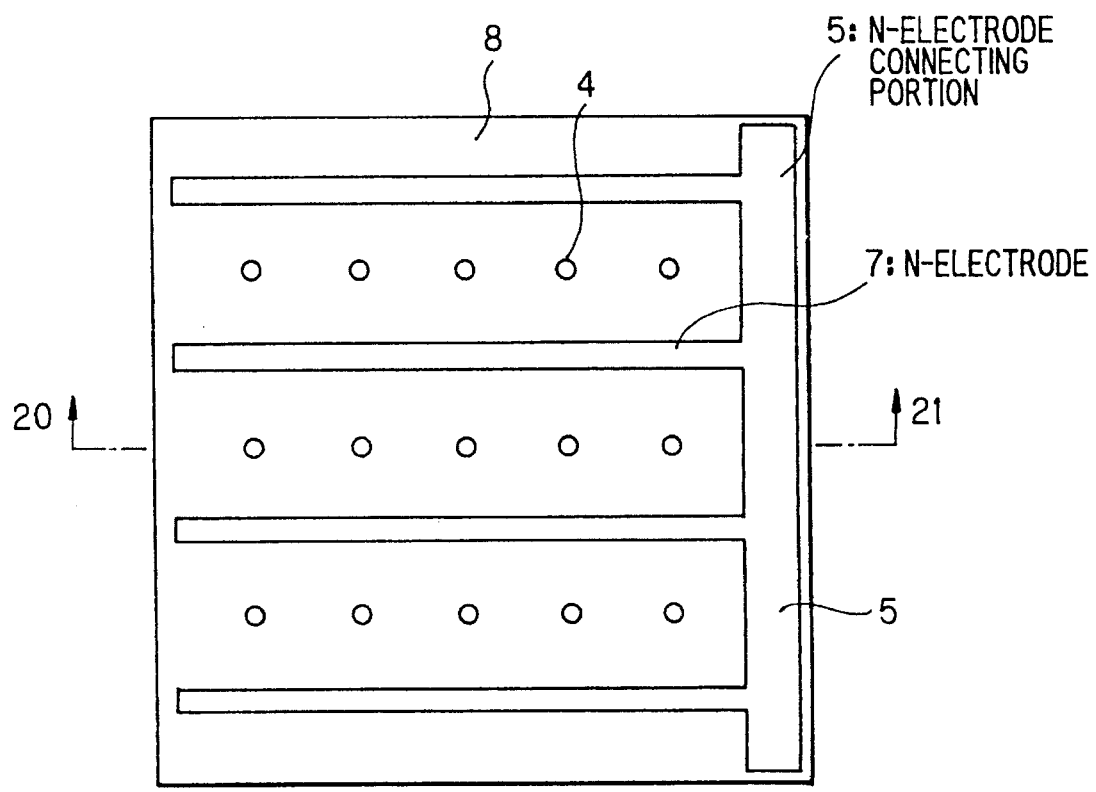
FIG. 1 is a plan view showing a prior art example of a solar cell.
Figure 2:
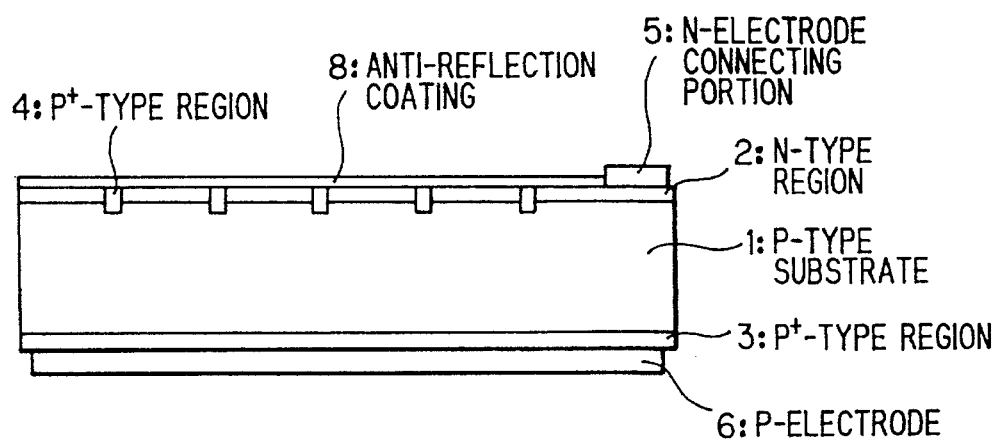
FIG. 2 is a sectional view taken on a line 20–21 in FIG. 1.
Figure 3A:
FIGS. 3A–3F are sectional views illustrating the steps of a process for producing the solar cell shown in FIG. 1.
Figure 3B:
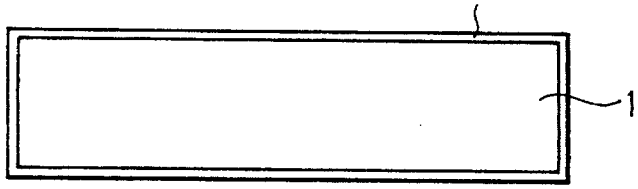
Figure 3C:
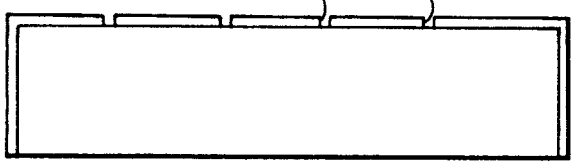
Figure 3D:
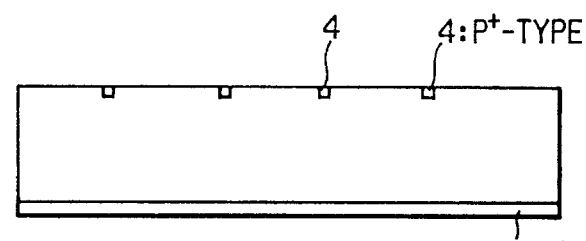
Figure 3E:
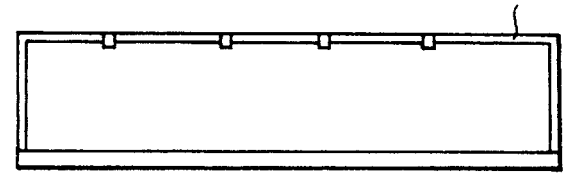
Figure 3F:
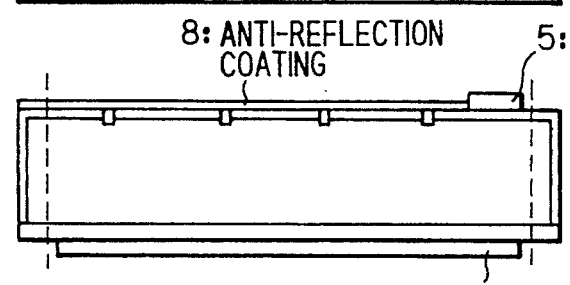
Figure 4A:
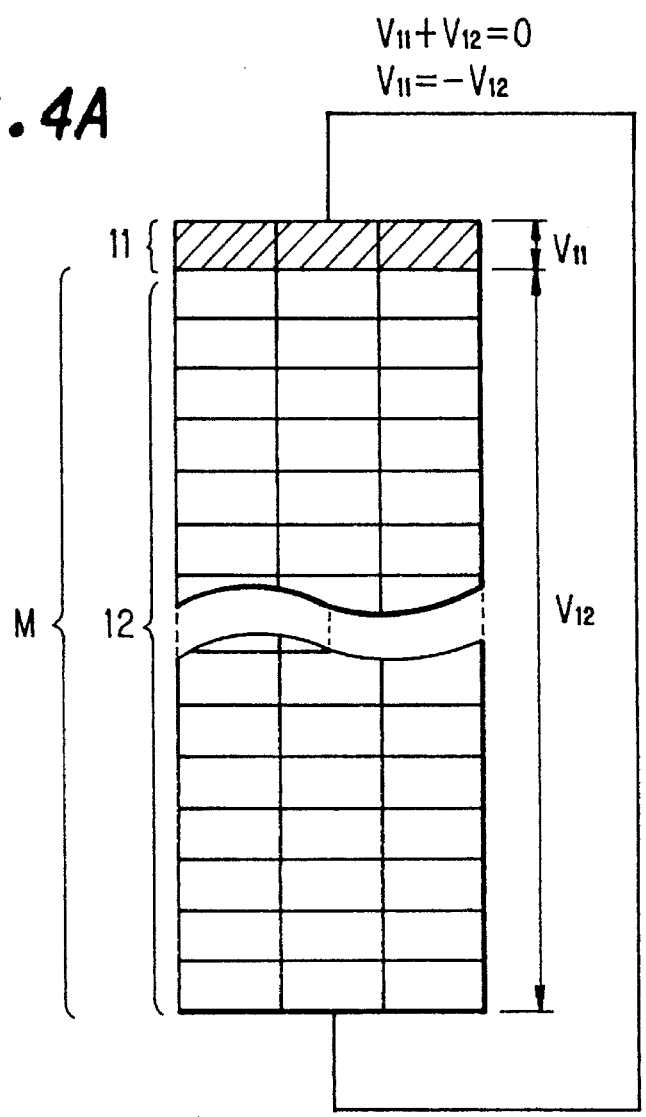
FIG. 4A is an illustrative view for explaining a reverse bias voltage applied to a solar cell, based on a configurational example of a solar cell module.
Figure 4B:
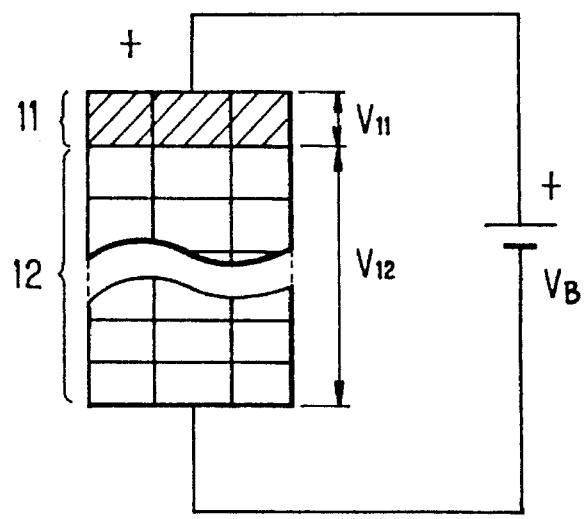
FIG. 4B is an illustrative view for explaining a reverse bias voltage applied to a solar cell, when a solar cell module is connected to an external power supply.
Figure 5:
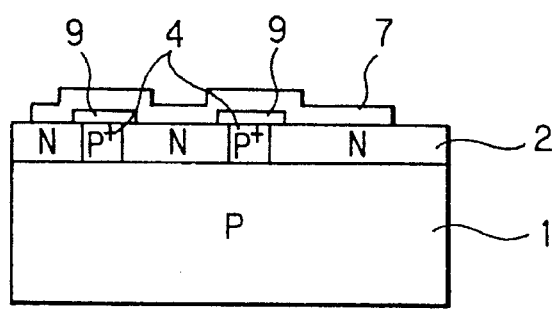
FIG. 5 is a schematic sectional view showing a first embodiment of a solar cell with integrated bypass function in accordance with the present invention.

FIG. 5 is a schematic sectional view showing an embodiment of a solar cell with integrated bypass function in accordance with the present invention. In the following description of the embodiment, the same components as in the conventional example shown in FIGS. 1 and 2 are designated with the corresponding reference numerals.

FIG. 5 shows an example in which a plurality of $P^+$-type islands 4 are formed inside N-type region 2 formed on the surface of a P-type substrate 1. These $P^+$-type islands 4 are formed under N-contact electrodes 7 with an insulator film 9 therebetween.

Figure 6:
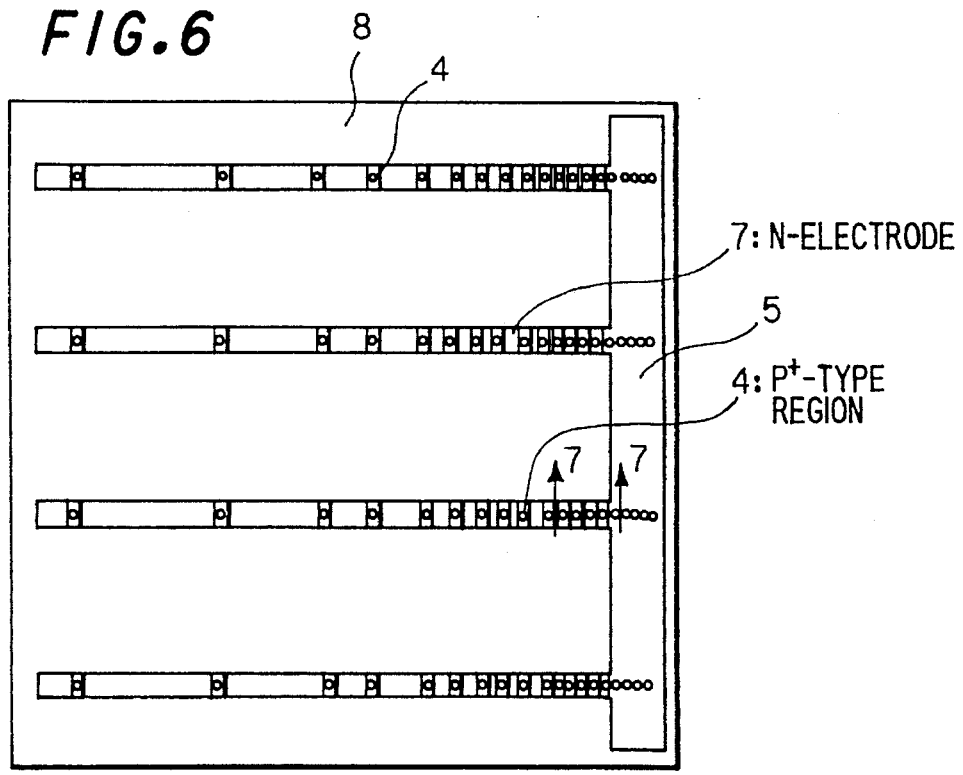
FIG. 6 is a plan view showing the solar cell shown in FIG. 5.
Figure 7:
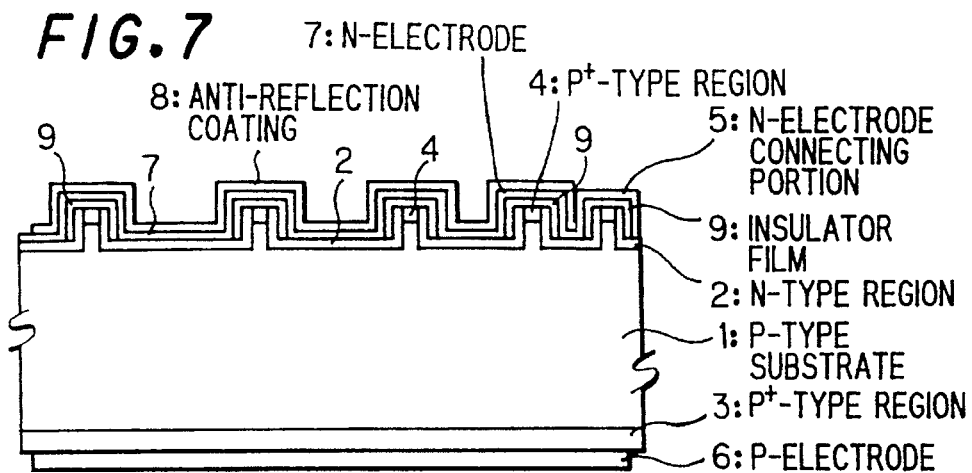
FIG. 7 is a sectional view taken on a line 7—7 in FIG. 6.

FIG. 6 is a plan view of the solar cell shown in FIG. 5 and FIG. 7 is a schematic sectional view taken on a line 7—7 in FIG. 6. FIGS. 8A through 8F are step-order sectional views showing an example of the process for producing the solar cell.

In FIGS. 6 and 7, similarly to the prior art example, an N-type region 2, an N-electrode connection portion 5, strip shaped N-contact electrodes 7 arranged like a comb and an antireflection coating 8 are formed on the top surface of a P-type substrate 1 while a P⁺-type region 3 and a P-contact electrode 6 are formed on the underside of the P-type substrate 1.

The difference between the solar cell of this embodiment and that of the prior art configuration is that plural, locally formed, small P⁺-type islands 4, 4, ... are scattered as third regions inside the N-type region 2 under the comb-shaped electrodes 7, 7, ... with the insulator film 9 therebetween. The third regions, or the small P⁺-type islands 4, 4, ... are also formed inside the N-type region 2 under the N-contact electrode connecting portion 5 with the insulator film 9 therebetween.

These P⁺-type islands 4, 4, ... have a higher dopant impurity concentration as compared to the P-type silicon substrate 1 and form a PN junction structure in cooperation with the N-type region 2 so as to cause breakdown due to the Zener effect or avalanche effect. The dopant impurity concentration in the P⁺-type islands 4 may and should be set to be $1\times10^{18} \text{cm}^{-3}$ or more to make the breakdown occur.

Figure 8A:
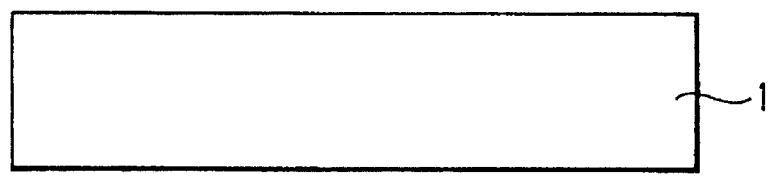
FIGS. 8A–8F are sectional views illustrating the steps of a process for producing the solar cell shown in FIG. 5.
Figure 8B:
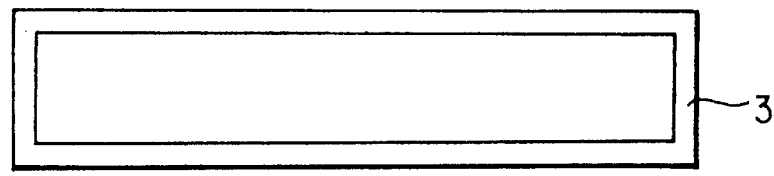
Figure 8C:
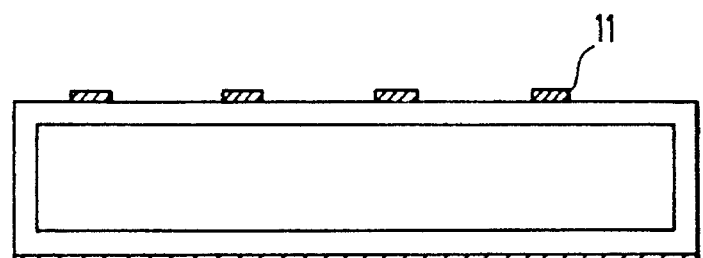

The solar cell thus configured is produced, for example as follows:

Initially, a P⁺-type dopant impurity is diffused to an impurity concentration of about $1\times10^{19}$ to $5\times10^{22} \text{cm}^{-3}$ into a P-type silicon substrate 1 as shown in FIG. 8A, so that a P⁺-type region 3 to be the third regions is formed on the whole surface thereof as shown in FIG. 8B. Then, an acid-proof photoresist resin 11 or the like, for example, is applied on the whole undersurface and part of the top surface (where desired high dopant concentration regions are formed). This stage is shown in FIG. 8C. Alternatively, an acid-proof tape may be applied on the undersurface of the substrate.

Figure 8D:
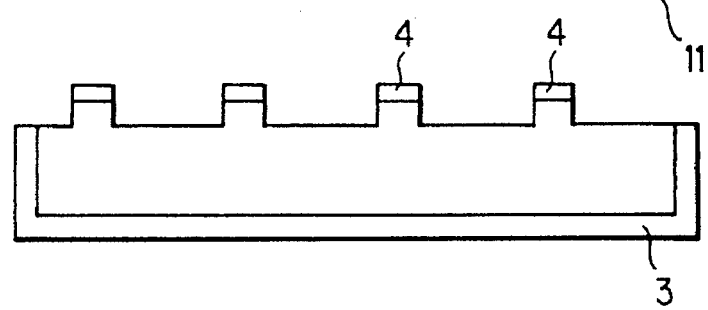
Figure 8E:
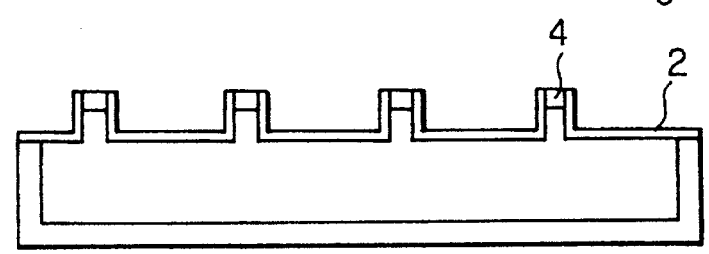

Then the substrate thus covered is immersed in an etchant consisting of a mixed acid, e.g. a mixture of hydrofluoric acid and nitric acid to etch it. Thereafter the aforementioned acid-proof resin or the tape is removed. This stage is shown in FIG. 8D. Subsequently, the N-type region is formed as shown in FIG. 8E on the top surface of the substrate by the thermal diffusion process. The P⁺-type islands 4, 4, ... will be protected by the layer of boron glass or the like which has been formed when the P⁺-impurity was diffused and remains in the top-most layer. In this N-type thermal diffusion process, there is concern that the N-type impurity penetrates into the P⁺-type islands, 4, 4, ... too deeply from the side thereof and disrupts the P⁺-type islands. To avoid this, the diffusion depth must be carefully regulated.

Figure 8F:
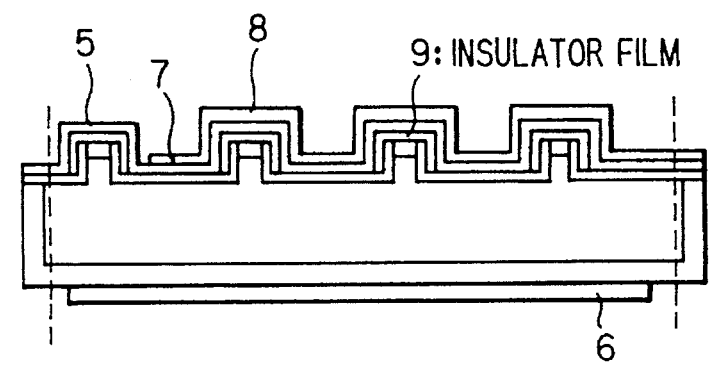

Subsequently, a similar treatment to be described later with reference to FIGS. 11B and 11C is done, whereby the insulator film 9 is formed on the top of the P⁺-type islands 4, 4, ... . After the formation of the insulator film 9 on the top of the P⁺-type islands 4, the comb-shaped N-contact electrodes 7 with the N-contact electrode connection portion 5 are formed on the top surface, as shown in FIG. 8F. Further, the antireflection coating 8 is formed on the top and the P-contact electrode 6 is vacuum-evaporated on the undersurface. The thus formed wafer is cut at both ends indicated by broken lines, whereby a solar cell as shown in FIGS. 6 and 7 is obtained.

This producing process is not much more complicated as compared to that of the prior art method shown in FIGS. 3A through 3F; therefore the production cost will not be increased very much.

in this case, the P⁺-type islands 4, 4, ... as the third regions must be adjusted as to size, number, and geometry, depending on the size, type etc., of each solar cell and the associated module. Typically, a solar cell having an area of 2 cm×4 cm should have about 5 to 10,000 islands having a diameter of from 10 μm to 200 μm or an equivalent area.

As the total area of the P⁺-type islands 4, 4, ... becomes large, the output power from the solar cell decreases. Therefore, the total area of the P⁺-type islands 4, 4, ... needs to be designed as small as possible within a range in which Zener breakdown or avalanche breakdown may occur and still the solar cell will not break. To meet this condition, the islands should be formed more densely in number in the areas close to the N-electrode connecting portion 5 so that the breakdown may easily occur while the P⁺-type islands 4, 4, ... should be reduced in number away from portion 5 as illustrated in FIG. 6.

Figure 13:
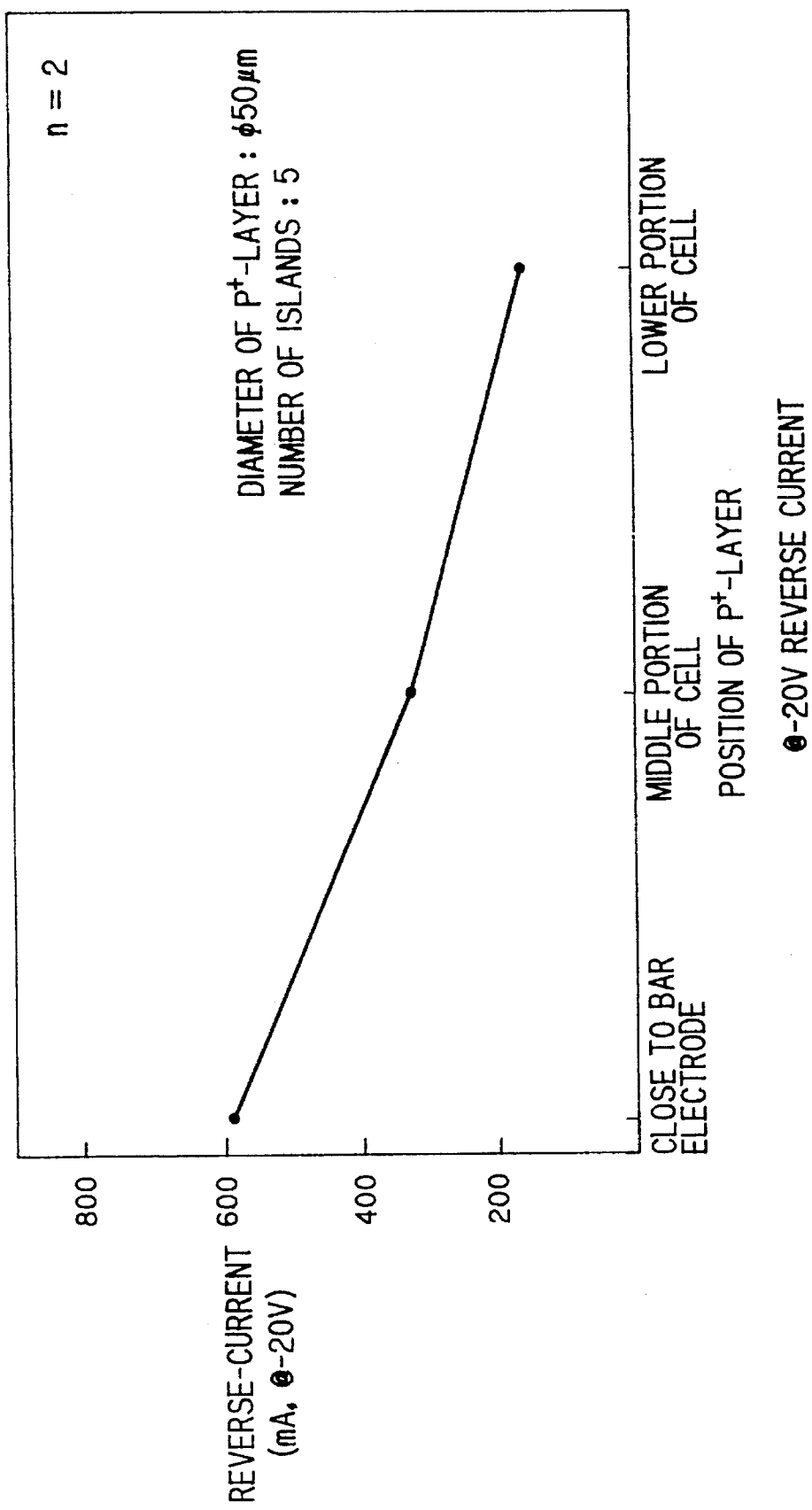
FIG. 13 is a chart showing the reverse current when a solar cell of the present invention is applied with a reverse bias of 20 V.
Figure 14:
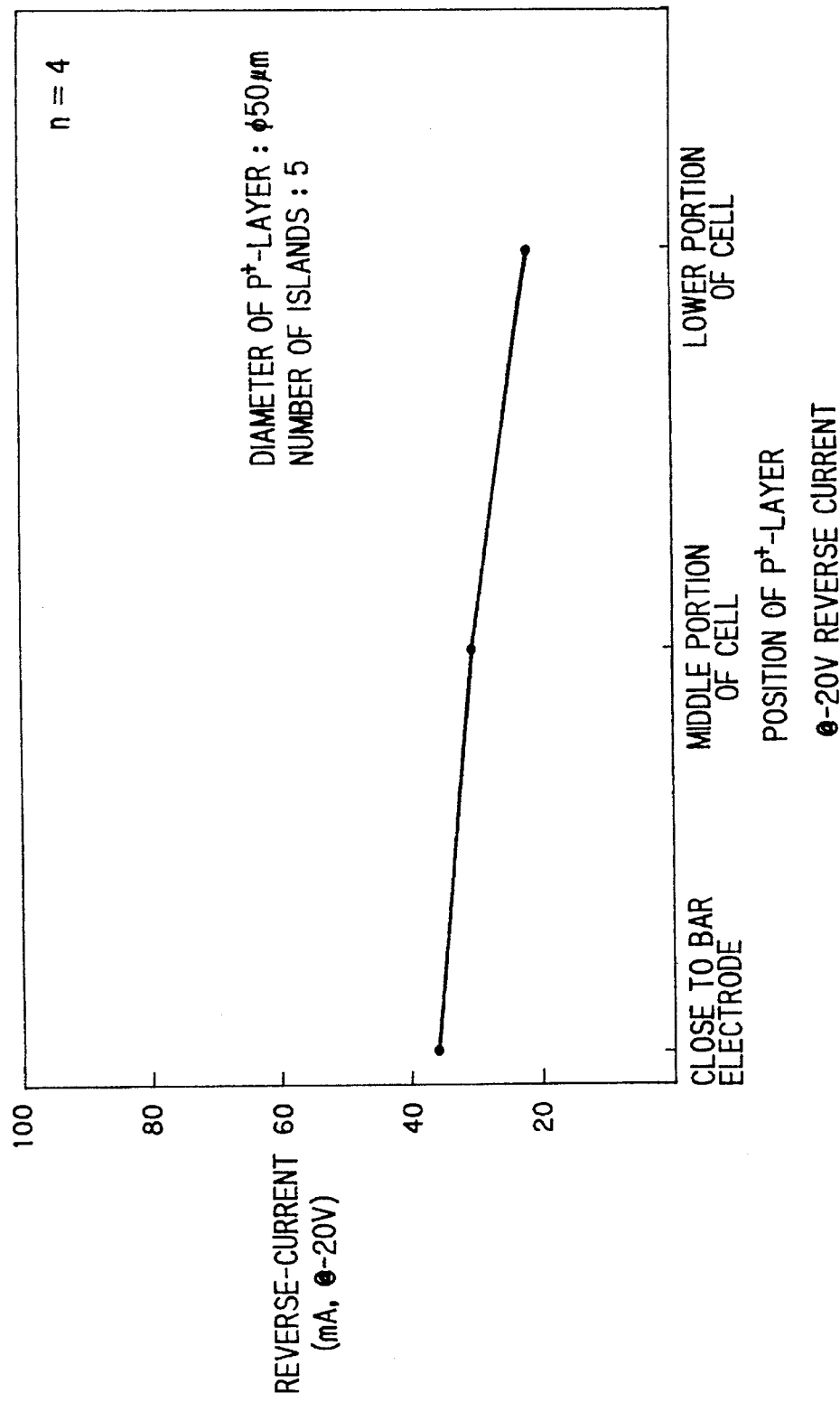
FIG. 14 is a chart showing the reverse current when a solar cell of the present invention is applied with a reverse bias of 5 V.

FIGS. 13 and 14 are charts showing the behavior of the reverse current for different reverse bias voltages in which the reverse current caused by the reverse bias voltage increases as the location of the P⁺-type islands 4, 4, ... becomes closer to the N-electrode connecting portion 5 (bar electrode). Here, FIGS. 13 and 14 show cases in which reverse bias voltages of 20 V and 5 V are applied respectively to a solar cell with five P⁺-type islands 4, 4, ... having a diameter of 50 μm scattered thereon.

Figure 9:
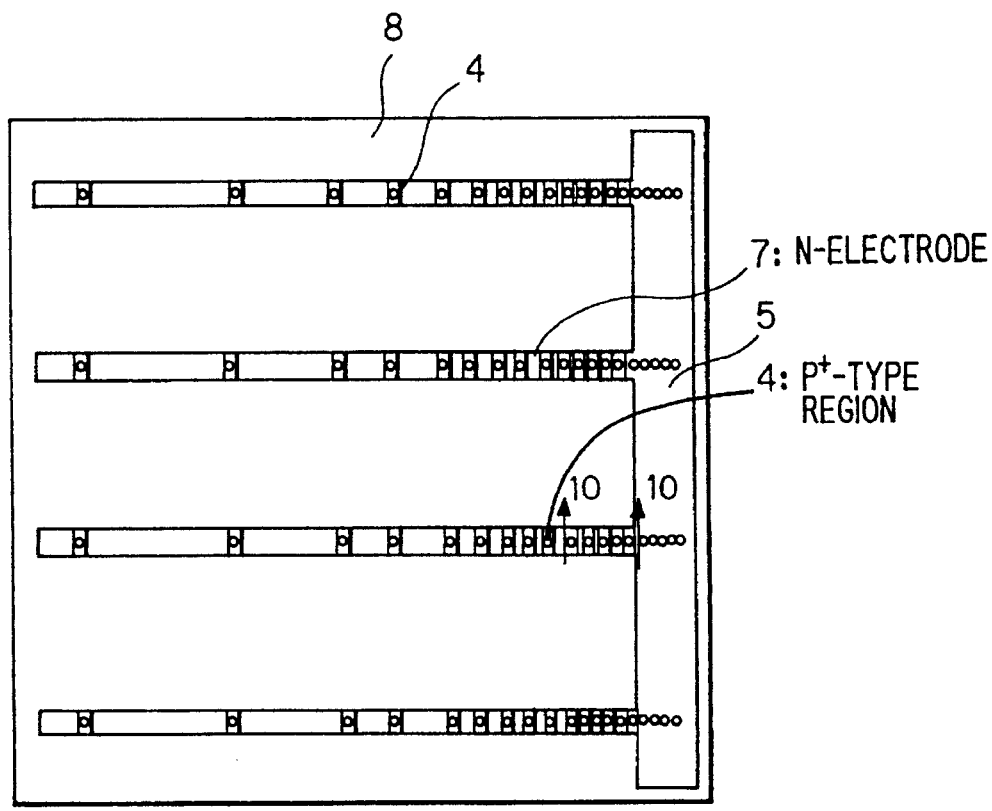
FIG. 9 is a plan view showing a second embodiment of a solar cell with integrated bypass function in accordance with the present invention.
Figure 10:
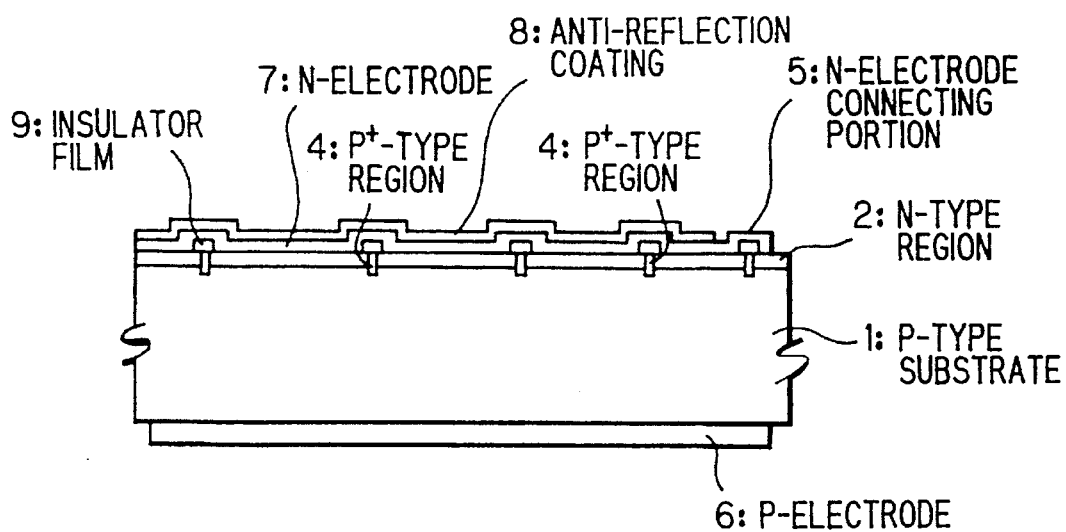
FIG. 10 is a sectional view taken on a line 10—10 in FIG. 9.
Figure 12:
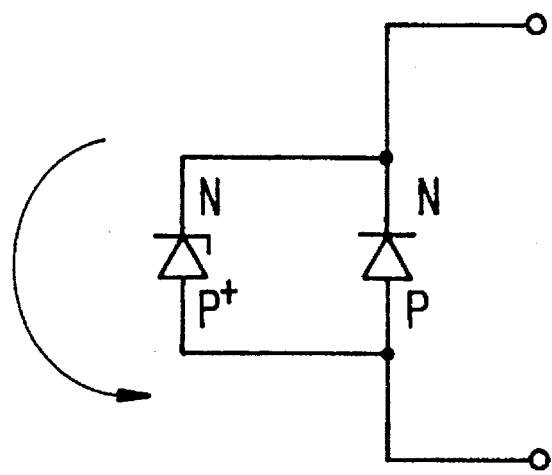
FIG. 12 is a diagram showing an equivalent electrical circuit of a solar cell with integrated bypass function.

FIGS. 9 and 10 show a second embodiment of a solar cell with integrated bypass function in accordance with the present invention. FIG. 9 is a plan view and FIG. 10 is a schematic sectional view taken on a line 10—10 in FIG. 9.

In FIGS. 9 and 10, similarly to the prior art example, the N-type region 2, an N-contact electrode connecting portion 5, strip-shaped N-contact electrodes 7 arranged like a comb and an antireflection coating 8 are formed on the top surface of a P-type substrate 1 and a P-electrode 6 are formed on the underside of the P-type substrate 1. Further, as in the first embodiment, plural, locally formed small P⁺-type islands 4, 4, ... are scattered as third regions inside the N-type region 2 under the comb-shaped electrodes 7, 7, ... with the insulator film 9 therebetween. In the second embodiment, the P⁺-type islands 4, 4, ... differ from those in the first embodiment. That is, the surface of the N-type region 2 is formed flush with that of the P⁺-type islands 4, 4, ... .

The P⁺-type islands 4, 4, ... in the third regions have higher dopant impurity concentration as compared to the P-type region 1 in the substrate and form PN junctions in cooperation with the N-type region 2 so as to cause breakdown due to the Zener effect or avalanche effect. The dopant impurity concentration in the P⁺-type islands may and should be set to be $1\times10^{18} \text{cm}^{-3}$ or more to make the breakdown occur. These conditions are the same with those in the first embodiment.

The solar cell thus configured is produced, for example, as follows. FIG. 11A to FIG. 11F show schematic sectional views of each production step.

Initially, the whole surface of the P-type silicon substrate 1 shown in FIG. 11A is subjected to thermal oxidation or the like so that an oxide film 10 is formed as shown in FIG. 11B.

Subsequently, as shown in FIG. 11 C, holes 14, 14, ... are formed on the upper surface of the oxide film 10. These holes 14, 14, ... correspond to P⁺-type islands 4, 4, ... which will be formed later.

Then, a P⁺-type impurity such as boron is diffused into the substrate to an impurity concentration of $1\times10^{22} \text{cm}^{-3}$, thereafter, the oxide film 10 is removed from the top, side, and underside surfaces. Thus, the substrate shown in FIG. 11D is obtained wherein plural P⁺-type islands 4, 4, ... are formed in the top surface.

Subsequently, as shown in FIG. 11 E, the N-type region 2 is formed on the top and side faces by the thermal diffusion technique or the like. Since the P⁺-type islands 4, 4, . . . are protected by the boron glass remaining on the topmost layer thereof, these regions are unaffected and kept in the forms of islands in the N-type region. Then, an acid-proof photoresist resin or the like is applied on the surface and the underside is removed by etching in, for example, a mixed acid of hydrofluoric acid and nitric acid.

Subsequently, a similar treatment effected as to FIGS. 11B and 11C is done, so that the insulator film 9 is formed on the top of the P⁺-type islands 4, 4, . . . .

Next, after the formation of the insulator film 9 on the top of the P⁺-type islands 4, the comb-shaped N-contact electrodes 7 with the N-contact electrode connecting portion 5 are formed on the top surface, as shown in FIG. 11F. Further, the antireflection coating 8 is formed on the top and the P-contact electrode 6 is vacuum-evaporated on the undersurface. The thus formed wafer is cut at both ends indicated by broken lines, whereby a solar cell shown in FIGS. 9 and 10 is obtained.

This producing process is not much more complicated as compared to that of the prior art method shown in FIGS. 3A through 3F; therefore the production cost will be increased very much.

The size, number and geometry as to the P⁺-type islands 4, 4, . . . are the same as those in the first embodiment.

In the above processes, the insulator film 9 can be formed by, for example, a CVD process employing SiH₄ gas and oxygen as starting materials or by a CVD process using decomposition of TEOS (tetraethoxysilane). Because the N-contact electrode is formed on the top of the insulator film, the insulator film is required to be fine and highly insulating. Accordingly, it is effective that the film is subjected to a short-time heat treatment such as RTA (Rapid Thermal Anneal), after the formation of the insulator film by the aforementioned CVD process.

In each of the embodiments described above, although no reference has been made to whether the solar cell belongs to the BSF type or the BSFR type, the difference between the two is only the metal composition of the P-electrode; therefore, this does not make any practical difference in the feature of the present invention.

Although, for convenience the above description has been made only with reference to solar cells using a P-type silicon substrate, the present invention can be applied to solar cells using an N-type silicon substrate or to solar cells using substrates of other than silicon monocrystal, such as GaAs, etc.

The present invention can be applied to both solar cells for space applications and for terrestrial applications.

As has been described heretofore, according to the present invention, a solar cell which is unlikely to be short-circuited and broken due to reverse bias voltages can be produced at low cost. Particularly, in a case where a solar cell array is used under such circumstances where maintenance is difficult to be performed, as in outer space, the present invention presents very effective protection against reverse bias voltages and therefore improves the reliability of the whole array. Since no externally attached bypass diode is needed, the production cost of the solar cell can be reduced.

Further, in accordance with the present invention, since conductive regions for providing bypass diode functions are formed under the light receiving surface electrode with an insulator film therebetween, it is possible to provide the bypass diode function without reducing the effective area of the light receiving surface of the solar cell. This prevents reduction in the photovoltaic conversion efficiency.

In accordance with the present invention, since conductive regions for providing bypass diode functions are integrally formed close to the light receiving surface electrode, it is possible to reduce the equivalent series resistance. Therefore, this is effective to further improve the protecting function against applications of the reverse bias voltage.

What is claimed is:

1. A solar cell with integrated bypass function, comprising:

a first conductivity type substrate selected from P-type and N-type substrates;

a region of a second conductivity type which is opposite from said first conductivity type, said region being formed on a light receiving side of said substrate;

at least one region of the first conductivity type, having a higher dopant impurity concentration than said substrate and being formed in a portion of the light receiving side of said substrate so as to be in contact with both said substrate and said region of the second conductivity type;

an insulator film formed on at least a part of said at least one region; and a light receiving side electrode formed on said insulator film so as to be in partial contact with said region of the second conductivity type, said electrode being electrically insulated from said at least one region by said insulator film.

2. A solar cell with integrated bypass function according to claim 1 wherein the quality of said insulator film is improved by effecting a heat treatment after the formation thereof.

3. A solar cell with integrated bypass function according to claim 1 wherein said at least one region of the first conductivity type is formed of plural islands.

4. A solar cell with integrated bypass function according to claim 3 wherein the density of said islands as said at least one region of the first conductivity type increases as the position of said islands approaches the portion of the light receiving side electrode connected to an output terminal.

5. A solar cell as in claim 1, wherein the light receiving side of the substrate includes at least one raised portion extending from the substrate and said at least one region is formed on the at least one raised portion extending from the substrate.

6. A solar cell as in claim 1 wherein the region of second conductivity is formed so as to be flush with an upper surface of said at least one region.

\* \* \* \* \*